United States Patent [19]

Nickol

[11] Patent Number: 4,544,238

[45] Date of Patent: Oct. 1, 1985

[54] SUBSTRATE HAVING DUMMY CONDUCTORS TO PREVENT SOLDER BUILD-UP

[75] Inventor: Friedrich W. Nickol, Eppstein, Fed. Rep. of Germany

[73] Assignee: VDO Adolf Schindling AG, Frankfurt am Main, Fed. Rep. of Germany

[21] Appl. No.: 458,396

[22] Filed: Jan. 17, 1983

[30] Foreign Application Priority Data

Mar. 27, 1982 [DE] Fed. Rep. of Germany ....... 3211408

[51] Int. Cl.⁴ ............................................... G02F 1/13
[52] U.S. Cl. .................................... 350/336; 350/357; 350/320; 156/901
[58] Field of Search ................. 350/336, 357; 156/901

[56] References Cited

U.S. PATENT DOCUMENTS 3,928,658 12/1975 Van Boxtel et al. ........... 350/336 X

FOREIGN PATENT DOCUMENTS 0055323 7/1982 European Pat. Off. .

Primary Examiner—John K. Corbin
Assistant Examiner—Richard F. Gallivan
Attorney, Agent, or Firm—Martin A. Farber

[57] ABSTRACT

A substrate having a conductor path of solderable material arranged thereon and having a solder layer applied to the conductor path by contact as the conductor path moves along molten solder material. In order to apply the solder material in uniform thickness with little deviation of tolerance onto the conductor path, another conductor path and/or a dummy conductor path of corresponding construction to the latter is arranged on the substrate closely alongside of the conductor path.

19 Claims, 2 Drawing Figures

SUBSTRATE HAVING DUMMY CONDUCTORS TO PREVENT SOLDER BUILD-UP

FIELD AND BACKGROUND OF THE INVENTION

The present invention relates to a substrate having a conductor path of solderable material arranged thereon and having a solder layer applied to the conductor path by contact as the conductor path moves along molten solder material.

Such substrates are known. Upon the application of the solder layer the conductor path is moved along the molten solder material and comes into contact with it. The solder material remains adhering to the conductor path. In particular, if the conductor path is moved transverse to its longitudinal direction along the molten solder material, the adherence of the solder material has the result that the solder material already applied to the conductor path remains for a moment connected to the solder material to be applied, even after the conductor path has already been moved away from this solder material. Only when a given distance away has been reached is this connection torn apart. As a result, a part of the solder material forming the connection is pulled back onto the conductor path which has been already provided with a layer of solder. As a result, however, the conductor path receives an excessively thick layer of solder.

In the case of a plurality of conductor paths some of which extend in the direction of movement of the substrate which moves past the solder material and the others transverse to said direction of movement the effect described above leads to substantially thicker layers of solder in the case of the transversely extending conductor paths than in the case of the longitudinally extending conductor paths.

The thickness of the layer of solder is also dependent on the width of the conductor path. This is due to the fact that in the case of wide conductor paths the layer of solder assumes a curved cross sectional shape and is thus substantially higher at the center than at the edge.

If the wide conductor paths are to be used as connections for insert-type contacts, the insert contacts slide off the curved conductor path even upon only slight vibration.

Another disadvantage of the larger solder cross sections is that due to the contraction in volume of the solder layer upon passage from the liquid to the solid state, this contraction amounting to about 9%, excessive stresses are produced between the conductor path coated with the solder and the substrate. In the case of a glass substrate with wide conductor paths as insert contacts in the region of its edge, this frequently leads to a crumbling of the glass.

SUMMARY OF THE INVENTION

The object of the present invention is to provide a substrate of the aforementioned type in which the solder material is applied in uniform thickness of little deviation in tolerance onto the conductor path.

This object is achieved in accordance with the invention in the manner that on the substrate, close alongside of the conductor path (3, 3'), there is arranged another conductor path (3, 3') and/or a dummy conductor path (4) corresponding in construction to the former. The additional conductor pathh (3, 3') or the dummy conductor path (4) can preferably be arranged approximately parallel to the first conductor path (3, 3') at a distance away from it of between 20 $\mu$m to 500 $\mu$m and preferably of 100 $\mu$m. This development in accordance with the invention has the result that upon application of the layer of solder to the conductor path the connection between the solder material of the solder layer and the solder material is interrupted as soon as the conductor path moves past the solder material since this solder material is at this time already in contact with a second conductor path or dummy conductor path arranged alongside of the first conductor path. At the dummy conductor path, which is arranged always in last position in the direction of movement, the solder which has been pulled along upon the emergence of the substrate from the solder material can then drain off.

Since no excess solder material can thus deposit as a result of adherence onto the conductor path, it is possible to make the thickness of the layer of solder uniform within low limits of tolerance.

Even in the case of a very fine structure of a plurality of conductor paths which are close alongside of each other, no short circuit is produced between the conductor paths as a result of too large a quantity of solder material, which could lead to bridging over of the space present between the conductor paths. Nevertheless, excellent application of solder is obtained with a high degree of certainty even in the case of an automatic continuous process.

If a plurality of conductor paths are arranged on a substrate, as for instance in the case of a cell wall of a liquid-crystal cell, in the region of whose the edge electronic components such as integrated circuits are to be soldered to the conductor paths, identical thickness of the conductor paths provided with the solder layer is of great importance. The soldering-on of the components is effected, namely, by means of a stamp which is brought from above onto the substrate and, in case of unequal conductor paths and thicknesses of solder, does not come to rest at all places on the conductor applied to the substrate. This leads to defective solder connections and thus to rejects.

If several conductor paths between which there is a larger distance are arranged on a substrate, then a plurality of dummy conductor paths (4), which preferably form a raster, can be arranged between two conductor paths (3) which are arranged at a larger distance from each other.

If the substrate is a glass substrate (1), the otherwise customary risk of crumbling at the edge of the glass due to excessive thermal stresses is avoided since the heat capacity present can be kept small due to the small thickness of the solder layer.

The conductor paths and/or the dummy conductor paths consist preferably of copper and can be produced by a photolithographic process. A tin-containing material can suitably be used as solder material.

The solder layer (5) of the conductor path (3, 3') and dummy conductor paths (4) may have a thickness of 2 to 50 $\mu$m and preferably 15 $\mu$m and can be applied with a tolerance of plus-minus 3 $\mu$m.

A larger-surface conductor path can be formed by a plurality of interconnected fine-structured conductor paths (3') which cover a corresponding area. In this way the solder material is prevented from arching so as to form a conical cross section, it rather covering the individual finely structured conductor paths in identical thickness. Furthermore, the danger of parts of the substrate crumbling off due to thermal stresses is avoided. This is particularly important when the large-surface conductor path forms a contact (7), arranged in the region of the edge of the substrate, for an insert contact since the risk of crumbling is particularly high in the edge region of the substrate. Slipping off of the insert contact from a conical contact point is no longer possible.

A particularly advantageous use of the invention is obtained if the substrate is a cell wall of a liquid-crystal cell and the conductor paths (3, 3') form the connections for control units.

BRIEF DESCRIPTION OF THE DRAWINGS

With the above and other objects and advantages in view, the present invention will become more clearly understood in connection with the detailed description of a preferred embodiment, when considered with the accompanying drawings, of which.

DETAILED DESCRIPTION OF THE PREFERRED EMBODIMENTS

Figure 1:
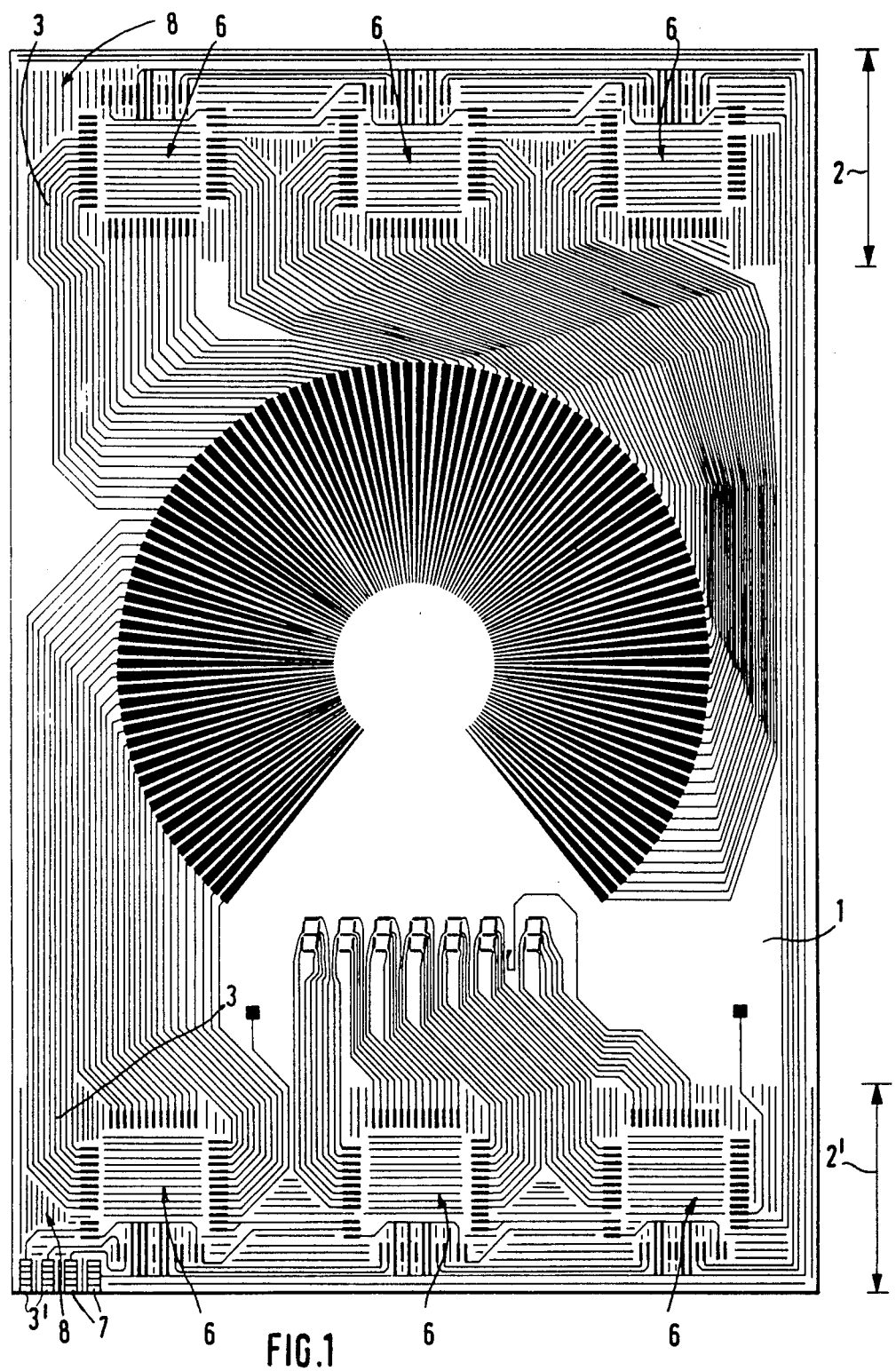
FIG. 1 is a view of a substrate in accordance with the invention.

The substrate shown in the figures is a glass substrate 1 and forms a cell wall of a liquid-crystal cell. In the side regions 2 and 2' the conductor paths 3 and dummy conductor paths 4, which are arranged closely adjacent each other on the glass substrate 1, consist of copper and are provided with a solder layer 5 of tin. The conductor paths 3 are connected, directly or via integrated circuits (not shown) which can be soldered on in the regions 6, with large-area contact places 7, while the dummy conductor paths 4 merely fill the free spaces between the conductor paths 3 in the side regions 2 and 2' in the form of rasters 8 and do not perform any function as electric conductor.

The large-area contact places 7 arranged in the region of the edge of the glass substrate 1 serve for the connection of insert contacts, not shown. The contact places 7 consist of a plurality of interconnected fine-structured conductor paths 3' which cover the surface of the contact places 7 in the manner of a net.

Figure 2:
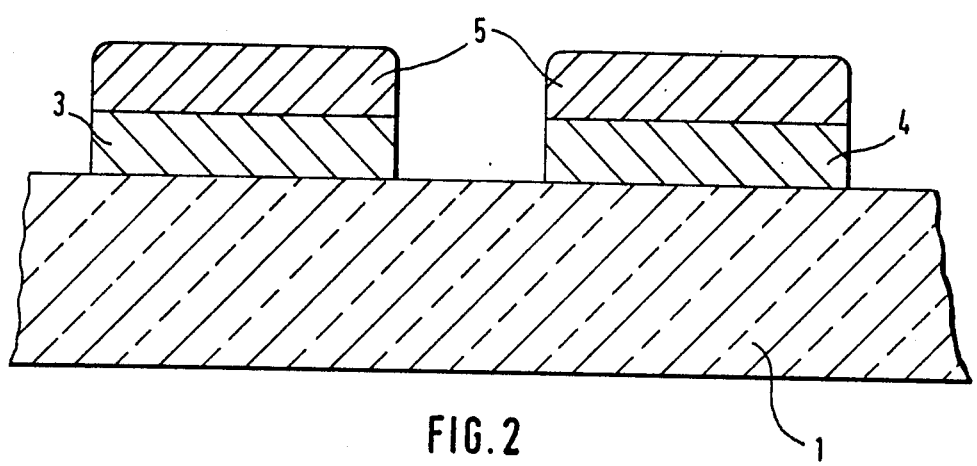
FIG. 2 is a portion of the substrate of FIG. 1, shown in cross section.

A cross section through the tin-coated conductor paths 3 and dummy conductor paths 4 is shown on an enlarged scale in FIG. 2. The solder layer 5 consisting of tin has a thickness of 15 $\mu$m. It was applied in the manner that the glass substrate 1 bearing the conductor paths 3 and dummy conductor paths 4 which had been previously applied by photolithography was moved along molten tin-containing material.

Since upon this movement the tin-containing material is at all times in contact with a conductor path 3, 3' or dummy conductor path 3 and thus with the glass substrate, there is no tearing off of this material from the glass substrate 1 during the entire movement. This has the result that the connection between solder material and conductor path 3, 3' and/or dummy conductor path 4 is interrupted immediately upon the moving past and no surplus quantity of solder material remains on the conductor path 3, 3' and/or the dummy conductor path 4. In this way the result is obtained that the solder layer 5 can be applied to all points of the side regions 2 and 2' in the same thickness within a tolerance of plus-minus 3 $\mu$m and without the formation of bridges between the adjacent conductor paths 3, 3' and dummy conductor paths 4.

I claim:

1. In a substrate having a conductor path of solderable material arranged thereon and having a solder layer applied to the conductor path by contact as the conductor path moves along molten solder material, the improvement comprising on the substrate, close alongside of the conductor path, at least one dummy conductor path is disposed corresponding in construction to said first mentioned conductor path.

2. The substrate according to claim 1, further wherein the dummy conductor path is disposed approximately parallel to the first mentioned conductor path.

3. The substrate according to claim 2, wherein
   the dummy conductor and the first mentioned conductor path are arranged at a spacing of between 20 $\mu$m to 500 $\mu$m.

4. The substrate according to claim 2, wherein
   the spacing is 100 $\mu$m.

5. The substrate according to claim 1, wherein
   the substrate is a glass substrate.

6. The substrate according to claim 1, wherein
   each said at least one dummy conductor path is made of copper.

7. The substrate according to claim 1, wherein
   the solder material is a tin-containing material.

8. The substrate according to claim 1, wherein
   the solder layer of the conductor paths including said at least one dummy conductor path has a thickness of 2 to 50 $\mu$m.

9. The substrate according to claim 8, wherein
   said thickness is 15 $\mu$m.

10. The substrate according to claim 8, wherein
    the thickness of the solder layer is applied with a tolerance of $\pm 3$ $\Xi$m.

11. The substrate according to claim 1, wherein
    said first mentioned conductor path is a large-surface conductor path comprising a plurality of interconnected fine-structured conductor paths.

12. The substrate according to claim 11, wherein
    the large-surface conductor path is configured as a contact.

13. The substrate according to claim 1, wherein
    the substrate is a cell wall of a liquid-crystal cell and the first mentioned conductor path is configured to serve as a connection for control units.

14. In a substrate having a conductor path of solderable material arranged thereon and having a solder layer applied to the conductor path by contact as the conductor path moves along molten solder material, the improvement comprising on the substrate, close alongside of the conductor path, at least one dummy conductor path is disposed corresponding in construction to said first mentioned conductor path; and a second conductor path spaced from said first mentioned conductor path by a relatively large distance, there being a plurality of dummy conductor paths which are arranged between said first mentioned and said second conductor paths.

15. The substrate according to claim 14, wherein
    the dummy conductor paths are arranged to form a raster.

16. A method of constructing an electrical circuit on a substrate comprising the steps of:

arranging solderable material on the substrate along the paths of an array of electrical conductors to be formed on the substrate, the substrate being electrically insulating and nonadhesive to solder material, placing further solderable material on said substrate in an arrangement of paths for dummy electrical conductors in peripheral regions of said array of electrical conductors, and dipping said substrate into molten solder material for coating said solderable material with the solder material to construct said electrical conductors, said electrical conductors being formed of said solderable material, said dipping being accomplished by passing said substrate through said molten solder material with said array of electrical conductors being removed from said molten solder prior to removal of said dummy conductors to prevent buildup of excess solder material on said array of electrical conductors.

17. The method according to claim 16, further comprising:

a spacing of said paths for the dummy conductors from the paths of the array of electrical conductors with a spacing sized for withdrawal of excess solder material from said array of electrical conductors to said dummy conductors.

18. The method according to claim 17, wherein the size of said spacing is in the range of 20 $\mu$m to 500 $\mu$m.

19. The method according to claim 17, wherein a dummy conductor is parallel to a conductor of said array of electrical conductors.

* * * * *